United States Patent [19]
Stillwagon et al.

[11] Patent Number: 5,215,867
[45] Date of Patent: Jun. 1, 1993

[54] METHOD WITH GAS FUNCTIONALIZED PLASMA DEVELOPED LAYER

[75] Inventors: Larry E. Stillwagon, Summit; Gary N. Taylor; Thirumalai N. C. Venkatesan, both of Bridgewater; Thomas M. Wolf, Succasunna, all of N.J.

[73] Assignee: AT&T Bell Laboratories, Murray Hill, N.J.

[21] Appl. No.: 54,147

[22] Filed: May 15, 1987

Related U.S. Application Data

[63] Continuation of Ser. No. 861,611, May 5, 1986, abandoned, which is a continuation of Ser. No. 532,776, Sep. 16, 1983, abandoned.

[51] Int. Cl.$^5$ .......................... G03F 7/36; G03F 7/008
[52] U.S. Cl. ................................ 430/323; 430/167; 430/194; 430/197; 430/270; 430/298; 430/311; 430/312; 430/313; 430/314; 430/315; 430/324; 430/325; 430/326; 430/327; 156/628; 156/643
[58] Field of Search ............... 430/298, 313, 314, 315, 430/323, 324, 325, 317, 326, 311, 312; 156/628, 643

[56] References Cited

U.S. PATENT DOCUMENTS

| | | | |
|---|---|---|---|
| 3,816,196 | 6/1974 | La Combe | 156/8 |
| 3,816,198 | 6/1974 | La Combe et al. | 156/16 |
| 3,977,954 | 8/1976 | Needles et al. | 204/159.12 |
| 4,195,108 | 3/1980 | Gazard et al. | 428/195 |
| 4,232,110 | 11/1980 | Taylor | 430/313 |
| 4,244,799 | 1/1981 | Fraser et al. | 204/192 E |
| 4,259,435 | 3/1981 | Broer et al. | 430/313 |
| 4,307,178 | 12/1981 | Kaplan et al. | 430/296 |
| 4,377,437 | 3/1983 | Taylor et al. | 430/313 |
| 4,396,704 | 8/1983 | Taylor | 430/311 |
| 4,426,247 | 1/1984 | Tamamura et al. | 156/643 |
| 4,552,833 | 11/1985 | Ito et al. | 430/325 |
| 4,613,398 | 9/1986 | Chiong et al. | 156/628 |
| 4,810,601 | 3/1989 | Allen et al. | 430/313 |
| 4,908,298 | 3/1990 | Hefferon et al. | 430/313 |

FOREIGN PATENT DOCUMENTS

| | | |
|---|---|---|
| 0058214 | 2/1981 | European Pat. Off. |
| 57-23937 | 5/1982 | Japan |
| 2154330 | 9/1985 | United Kingdom |

OTHER PUBLICATIONS

"Polarity Reversal of PMMA By Treatment With Chlorosilanes", *Extended Abstracts*, D. Follett et al., Oct. 17-21, 1982, pp. 311-328.
"A breakthrough to the plasma deposited dry-developable e-beam resist", *Technical Papers*, Shuzo Hattori et al., Nov. 8-10, 1982, pp. 311-328.
"Multilayer Resist Systems and Processing", *Solid State Technology*, T. J. Watson, May 1983, pp. 105-112.
"The Status of Dry-Developed Resists for Each Lithographic Technology", *VLSI Electronic:Microstructure Science*, vol. 8 Taylor et al., 1983, pp. 217-253.
"Session GJ: Superconducting Microbridges and Proximity Effects", *Bulletin of the American Physical Society*, vol. 23, No. 3, Mar. 1978, Published for the American Physical Society by the American Institute of Physics, p. 357.
"Laser Direct-Write Processing", Lincoln Laboratory, Massachusetts Institute of Technology Abstract, 1983, May 31-Jun. 3, 1983, 1981 Int'l Symposium on Electron, Ion & Photo Beams.
"Dry Developed Resists For Each Lithographis Tech.", *Microcircuit Engineering* 81, Taylor et al., Sep. 28-30, 1981, pp. 381-385.
"Dry Developed Resist-An Overview and Discussion of Recent Results", 1982 International Conference & Seminar Proceedings, Advanced Plasma Technology, Taylor et al., Jan. 26-28, 1982, pp. 44-54.

*Primary Examiner*—Charles L. Bowers, Jr.
*Attorney, Agent, or Firm*—James H. Fox

[57] ABSTRACT

A resist is formed by sorption of an inorganic-containing gas into an organic material. The development of the resist occurs by exposure to a plasma (e.g., oxygen reactive ion etching) that forms a protective compound (e.g., a metal oxide) selectively in the resist. The selected regions can be defined by patterning radiation of various types, including visible, ultraviolet, electron beam, and ion beam. In an alternate embodiment, the selected regions are defined by an overlying resist, with the gas sorption protecting the underlying layer in a bilevel resist. The protective compound can protect the organic resist layer during etching of an underlying inorganic layer, such as metal, silicide, oxide, nitride, etc.

53 Claims, 8 Drawing Sheets

METHOD WITH GAS FUNCTIONALIZED PLASMA DEVELOPED LAYER

This is a continuation of Ser. No. 06/861,611 filed May 05, 1986 (abandoned), which was a continuation of Ser. No. 06/532,776 filed Sep. 16, 1983 (abandoned).

BACKGROUND OF THE INVENTION

1. Field of the Invention

The present invention concerns a method of making articles by the use of an organic layer developed by a plasma atmosphere for pattern delineation.

2. Description of the Prior Art

In the production of solid-state devices, including, for example, semiconductor devices, magnetic bubble devices, optical waveguide devices, etc., it is necessary to form patterns having very small dimensions on a substrate or other device precursor. In addition, lithographic shadow masks are likewise patterned to define device geometries. Lithographic resists are typically used that are patterned by radiation and developed. The developed pattern may thereafter be transferred to an underlying layer by a variety of techniques, including plasma etching, ion milling, ion implantation, wet chemistry, etc. The patterning radiation has included a variety of types, including electron beams, ultraviolet light, and visible light. Other sources are also being explored, including X-ray radiation and ion beams. In the past, the development of the irradiated resist has frequently been by dissolution of the irradiated or unirradiated regions of the resist by means of a development solution. This produced either a positive tone image or a negative tone image, respectively, depending upon the resist chemistry and developer type. Recently, a trend has occurred away from liquid developers, especially in very fine line lithography. Dry development has been accomplished by exposure of the resist to a plasma; see, for example, U.S. Pat. No. 4,232,110, coassigned with the present invention.

It has been found by one of the present inventors that by including an organometallic monomer in a polymeric resist, protective regions can be formed in irradiated regions of a resist upon plasma etching. For example, protective oxide regions can be formed in an oxygen plasma that etches the unprotected regions; see U.S. Pat. No. 4,396,704, coassigned with the present invention. Both silicon and nonsilicon organometallic monomers have been found useful. Another recent lithography technique has been developed by two of the present inventors, whereby ions, for example metallic ions, are selectively implanted in a material. The implanted ions react with a plasma, typically oxygen, to form a compound that protects the implanted region upon subsequent plasma etching; see U.S. Pat. No. 4,377,437, coassigned with the present invention.

Not only must a resist technology provide for the generation of fine lines, but in many cases it must also accommodate step coverage over previously formed features on a device precursor, while still maintaining the geometry of the pattern as it is transferred from the resist into the device precursor. Maintaining fine lines usually requires relatively thin resists, whereas providing good step coverage usually requires relatively thick resists. To accommodate these conflicting requirements, multilevel resists have been invented. In the multilevel technique, a relatively thick resist is initially applied to a device precursor to provide for good step coverage and provide a relatively planar surface, with a thin resist being deposited thereon. A pattern is then generated in the thin resist and transferred to the underlying layer by reactive ion etching or other techniques. It is also frequently advantageous to interpose a hard metallic or oxide layer between the two resist levels; see, for example, U.S. Pat. No. 4,244,799, coassigned with the present invention. For a recent review of multilevel resist technology, see "Multilayer Resist Systems and Processing," B. J. Lin, *Solid-State Technology*, pages 105–112, May 1983.

SUMMARY OF THE INVENTION

We have invented a technique for pattern delineation for making an article by sorption of an inorganic-containing gas into an organic layer, typically a polymer. A protective compound comprising the inorganic species is formed in the layer. In a first embodiment, the protective compound is selectively defined by actinic irradiation of the organic layer before, during, or after the gas sorption. The organic layer is then developed by exposure to a plasma that removes unprotected portions of the layer. In a second embodiment, the organic layer is selectively defined and developed by conventional lithographic techniques. The protective compound is then formed in the layer, and serves to protect an underlying layer of a device precursor from a plasma etching atmosphere. A desired pattern is thus transferred to the underlying layer, which can be organic or inorganic. In a third embodiment, the selected regions are defined by an overlying layer, for example a top layer in a multilevel resist, with the gas sorption occurring in the underlying organic layer. Subsequent plasma development removes the top layer and portions of the underlying layer not protected by the protective compound. The plasma can assist in forming the protective compound, which can include a species derived from the plasma. For example, an oxygen plasma can be used to form an inorganic oxide in an oxygen plasma can be used to form an inorganic oxide in selectively sorbed regions of the organic layer, while also etching the unprotected regions. Other types of plasmas are possible.

DETAILED DESCRIPTION

Figure 1:
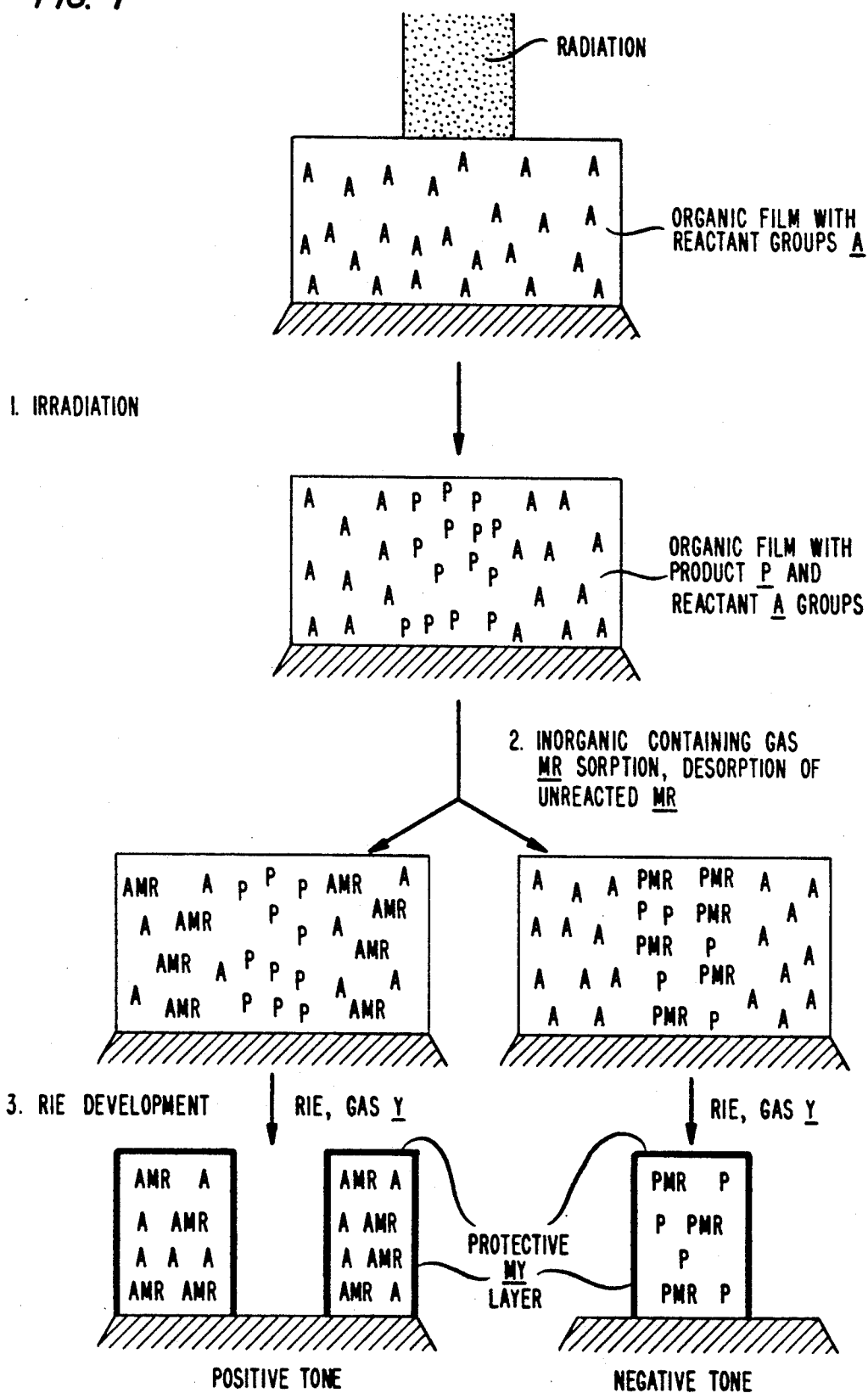
FIG. 1 shows an embodiment of the present technique wherein patterning lithographic radiation forms reaction products substantially through the thickness of an organic layer, and wherein exposure to an inorganic-containing gas MR provides for either positive tone or negative tone images depending on reaction of reactant A or product P groups with MR, respectively.

The following detailed description relates to a technique for forming lithographic images, wherein an inorganic-containing gas is sorbed into an organic layer, typically a polymeric resist film. An inorganic species derived from the sorbed gas forms a protective compound in the organic layer that protects the organic layer or an underlying layer, or both, during exposure to a plasma etching atmosphere. The protective compound may also include a species derived from the plasma. As used herein, the term "sorb" and its derivatives includes both the case wherein the gas is adsorbed only in a surface or near-surface region of the organic layer, as well as the case wherein the gas is absorbed substantially through the entire thickness of the layer. The term "functionalize" and its derivatives mean that the sorbed gas chemically reacts or complexes with either a constituent of the organic layer, or with an external agent such as water vapor in the ambient above the layer, or both.

In one embodiment, the functionalization occurs selectively either in an irradiated or unirradiated region of the organic layer. The irradiation of the organic layer can occur before, during, or after the gas sorption, depending on the radiation type and chemistry involved. The sorbed gas that remains unreacted is typically then desorbed, by evacuation, heating, etc. The organic layer is developed by exposure to a plasma, whereby unprotected portions of the organic layer are removed, thereby producing a desired pattern in the organic layer.

In a second embodiment, the desired lithographic pattern is initially formed in the organic layer by conventional techniques, as by liquid development or conventional plasma development of a selectively irradiated resist. The developed resist is then functionalized with the inorganic-containing gas. The protective compound formed in the resist then serves to selectively protect an underlying layer, which may be organic or inorganic, from a plasma etching atmosphere. In this manner, the pattern formed in the resist is transferred to the underlying layer.

The inorganic species of the sorbed gas can be a metal or other element capable of forming a relatively nonvolatile protective compound. Suitable elements include those conventionally considered to be metallic elements by organic chemists in the formation of organometallic compounds. In addition to true metals, such elements include silicon, germanium, boron, etc. The inorganic species should be capable of forming a protective compound that resists the plasma that etches the unprotected regions of the desired layer to be etched. For this purpose, a protective compound having a vaporization (boiling) point of at least 300 degrees C., and preferably at least 500 degrees C, is desirable. The term "plasma," as used herein, means an atmosphere having at least one ionized species in an amount effective to assist the etching of the unprotected portions of the desired layer, and the term includes reactive ion etching, among other techniques. The term "resist" is also used illustratively herein when referring to an organic layer. However, the organic layer need not perform as a resist on a device precursor, but can be used itself in a device, as for optical diffraction gratings, waveguides, etc.

The functionalized plasma-developed resists in one embodiment behave according to one of the two routes outlined in FIG. 1. In this Figure, an organic layer, typically a polymer, comprises reactive groups A, which upon irradiation form product groups P at the expense of A. Groups A are thereby depleted in the exposed regions. Next, the exposed film is treated with a reactive gas MR containing reactive groups R and inorganic atoms M capable of forming nonvolatile compound MY, which is resistant to removal under reactive ion etching (RIE) conditions using gas Y. Several situations are now possible. (1) If the inorganic-containing gas does not diffuse into the film and/or does not react with either the exposed or unexposed areas, no inorganic functionalization will occur, and no amplification upon development is expected. (2) Conversely, if the inorganic-containing gas diffuses everywhere and reacts with both A and P, no etching would be expected to occur upon RIE development. (3) If, however, gas diffusion occurs and reaction with either A or P occurs, selective functionalization results. This is typically followed by substantial desorption of the unreacted MR. The protective compound MY is then formed, which can occur with the aid of the development plasma. The plasma development can produce either negative tone images when the inorganic compound bonds selectively to P, or positive tone images when it selectively bonds to A. Tone is thus dependent upon both the actinically generated species (radiation chemistry) and selective functionalization (organometallic chemistry). Note that the protective MY compound may cover both the top and sides of the developed pattern, as shown in FIG. 1. However, in many cases, only a top protective layer is necessary, with the exact disposition being a function of the chemistry involved.

Since the functionalizing step is a gas-solid reaction, surface layers of the resist react first if the reaction rate constant is equal to, or greater than, the diffusion rate constant, or if the major portion of the incident radiation is absorbed in the topmost (approximately 1,000-2,000 Angstrom) layer of resist. For the first case, a reactive gas diffusing into a polymer film, the concentration c of a gaseous species at a depth x (in μm) into a film from the film surface can be estimated by Equation (1) where $C_0$ is the continuous gas concentration at the surface, D is the diffusion coefficient in $cm^2 sec^{-1} \times 10^6$, and t is the diffusion time in seconds.

$$C = C_0 \, erfc \frac{x}{2\sqrt{Dt}} \quad (1)$$

This is the simplified plane sheet solution to the one-dimensional diffusion problem.

For the present purposes, it is analytically convenient to calculate $C/C_0$ as a function of the variables x, D, and t. Some results are given in Table 1 for two polymers of interest. In all cases, both inert ($O_2$, Ar) and interactive ($SF_6$) gases diffuse more readily into rubbery poly(isoprene) PI than into glassy poly(ethyl methacrylate)

PEM. In fact, for PI, after treatment for 1 second, the gas concentration is expected to be higher in a 1 μm film than in the gas phase for each gas listed. Only for PEM and large molecule gases (Ar, SF$_6$) are C/C$_0$ values less than 1.0 found. With SF$_6$, a significant interaction with the PEM ester carbonyl is expected. Consequently, D is very low and no gas penetrates even 1 μm deep for treatment times as long as 10 seconds. At shallower depths, a gradient of SF$_6$ is expected. Reaction in the near-surface top 2,000 Angstrom region is clearly favored by short treatment times and low diffusion coefficients associated with large gas molecules and glassy polymers.

Figure 2:
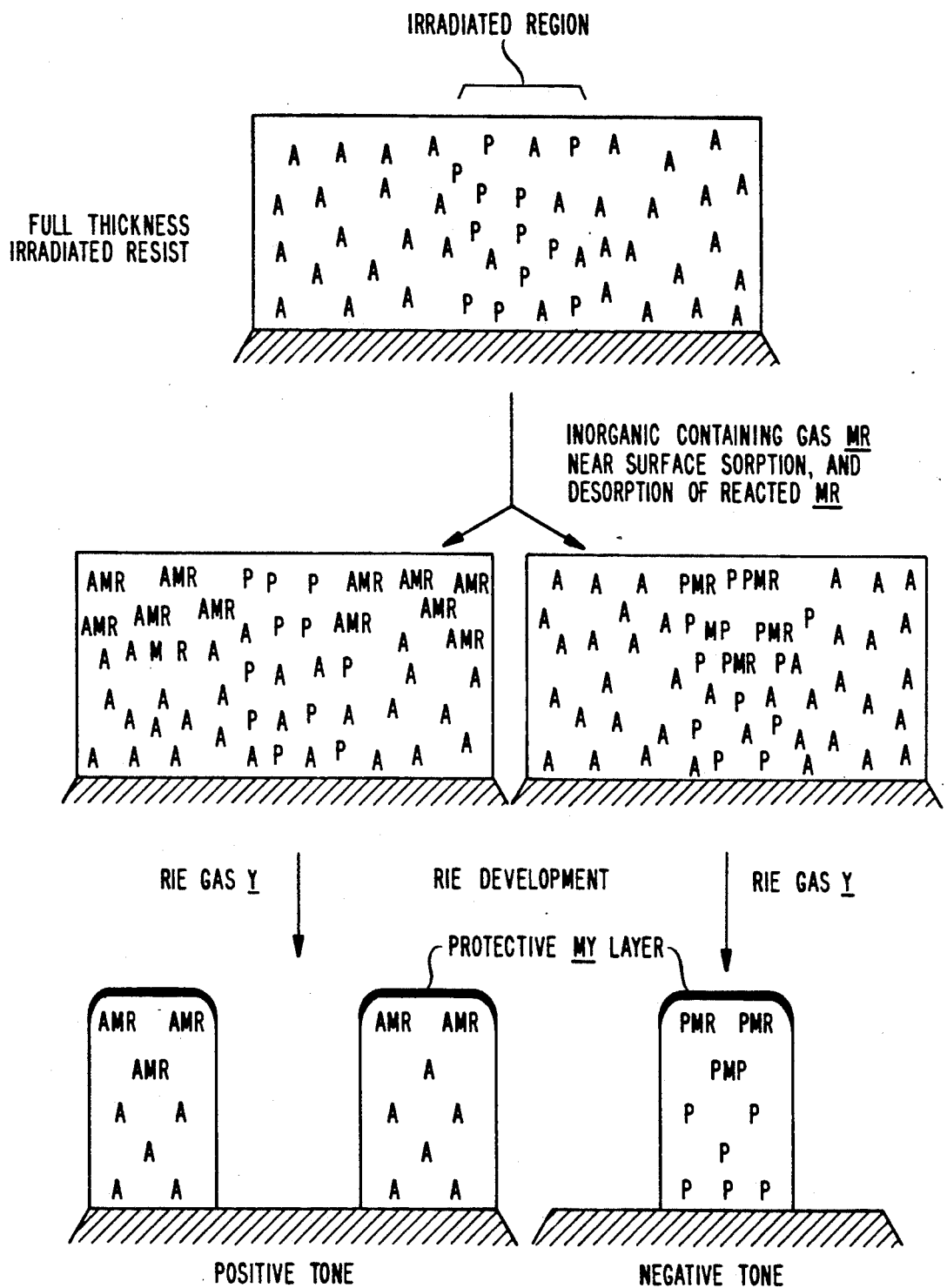
FIG. 2 shows an embodiment of the present technique wherein the inorganic-containing gas sorption occurs substantially only in a near-surface region of the organic layer to produce a positive tone or negative tone image.

The glass transition temperature (T$_g$) of a polymer and the processing temperature determine the state of the polymer. Hence, a polymer can be processed in the rubbery state by performing the sorption, desorption, or functionalization steps at a temperature above T$_g$. This allows, for example, faster diffusion of the gas into the polymer. Conversely, processing below T$_g$ helps provide for a near-surface functionalization. As used herein, the term "near-surface" means effective sorption to less than one-half the thickness of a layer whose pattern is determined by actinic lithographic irradiation applied thereto. In the case of an underlying layer of a multilevel resist, the term "near-surface" means effective sorption to a thickness less than one-tenth the minimum linewidth desired. The state of the polymer can be shifted by changing the temperature during processing. For example, gas sorption and functionalization below T$_g$ can result in a well-defined near-surface pattern, whereas increasing the temperature above T$_g$ can provide for rapid desorption to allow faster processing; other temperature sequences are possible. FIG. 2 presents a representation of the foregoing near-surface functionalization. The lithographic radiation is shown as substantially penetrating the thickness of the resist, producing P therethrough. However, a lithographic radiation that penetrates only partially into the resist can also be used. Both positive tone and negative tone images can be obtained, as before.

TABLE 1

Dependence Of C/C$_0$ On Polymer And Gas Diffusion Properties And On Processing Properties At 25° C.

| Gas | D cm$^2$ × 10$^6$ / sec | t (sec) | x (μm) | C/C$_0$ |
|---|---|---|---|---|
| A. Poly(isoprene), T$_g$ = −73° C. | | | | |
| O$_2$ | 1.73 | 1.0 | 1.0 | 1.45 |
| Ar | 1.36 | 1.0 | 1.0 | 1.42 |
| SF$_6$ | 0.115 | 1.0 | 1.0 | 1.03 |
| B. Poly(ethyl methacrylate), T$_g$ = 65° C. | | | | |
| O$_2$ | 0.103 | 1.0 | 1.0 | 1.00 |
| Ar | 0.020 | 1.0 | 1.0 | 0.65 |
| SF$_6$ | 0.00022 | 1.0 | 1.0 | 0.00 |
| SF$_6$ | 0.00022 | 1.0 | 0.5 | 0.00 |
| SF$_6$ | 0.00022 | 1.0 | 0.1 | 0.67 |
| SF$_6$ | 0.00022 | 10.0 | 1.0 | 0.00 |
| SF$_6$ | 0.00022 | 10.0 | 0.5 | 0.44 |
| SF$_6$ | 0.00022 | 10.0 | 0.25 | 0.77 |
| SF$_6$ | 0.00022 | 10.0 | 0.1 | 1.15 |

Figure 3:
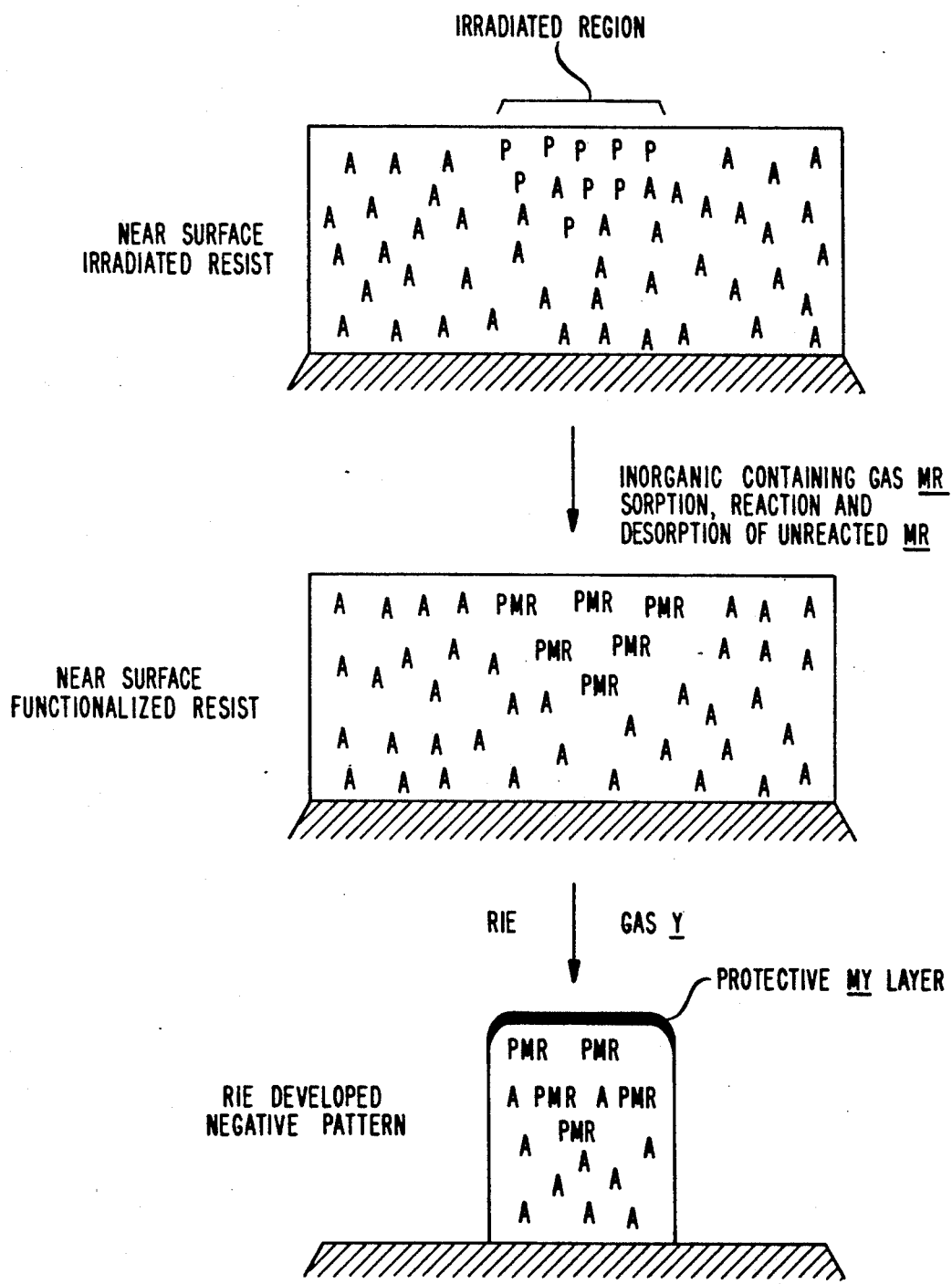
FIG. 3 shows an embodiment of the present technique wherein the patterning lithographic radiation is substantially absorbed in a near-surface layer of the organic layer, whereby a negative tone image is obtained.

An alternative to diffusion-controlled reactions in the near-surface region is irradiation of the resist selectively in the near-surface region, followed by gas functionalization, desorption of unreacted MR, and RIE development as above. This is represented schematically in FIG. 3 for the negative tone case. In the case of diffusion of inorganic reagent MR throughout the film, only the negative tone can be achieved in theory. Selective functionalization of original species A to obtain positive tone formation in this instance results in reaction of subsurface layers as well, thus preventing development of positive tone patterns. The consequence is at best only relief image formation upon development, rather than complete development. In the case of restricted gas permeation to the near-surface regions, positive tone can be formed, with advantages being derived from the near-surface irradiation.

Near-surface irradiation can be achieved most readily with ion beam lithography and photolithography. Use of low energy (approximately 20–50 keV), high atomic number (Z) ions permits irradiation of only the top 100 to 2,500 Angstroms of a typical organic resist because of the very rapid stopping of the ionic species. For UV and visible photons, resists containing 10 weight percent of compounds having $\epsilon \geq 40,000$ l/mole-cm at the radiation wavelength absorb $\geq 90$ percent of the incident light in the topmost 2,500 Angstroms and $\geq 40$ percent in the first 1,000 Angstroms. In the vacuum UV ($\lambda < 190$ nm), many polymers have $\epsilon_{values} > 10^5$ l/mole-cm, while highly conjugated aromatic materials have similar absorbences in 190–700 nm region. Materials which meet the high absorbence criteria are, therefore, readily available for ion or photon irradiation. In the photon case, improved resolution can result, whereas for ions, sensitivity can be enhanced by the use of the near-surface irradiation embodiment.

In electron lithography, large benefits can be realized by the present technique. These result because the proximity effect, which distorts pattern size as a function of geometry in the 1 μm to 0.1 μm range, can be reduced. The present resist scheme, as embodied in FIG. 2, can achieve this, since only the near-surface portion of the organic layer in this embodiment is selectively functionalized by the inorganic species, thus reducing the contributions to exposure by electrons backscattered from the substrate.

Usually an oxygen plasma is employed in the development step because most inorganic oxides act as excellent in situ masks (i.e., have low etch rates), and inorganic-free organic materials have relatively high etch rates. However, freon, halocarbon (CCl$_4$, CHBr$_3$), or even reducing (H$_2$) plasmas, among others, can be used if the corresponding inorganic compound formed therewith is nonvolatile. For example, many metals are likely to make good masks for H$_2$ plasma development. Their efficiencies are limited primarily by the metal atom sputter yields and ease of conversion to volatile hydrides. An analysis of the Group IV elements is illustrative. In Table 2 we list the boiling points of hydrides, oxides, and halides for these elements. Only Pb appears suitable for hydrogen plasma etching if conversion to the hydride by the plasma were efficient. Oxygen etching is useful for Si, Ge, Sn, and Pb, while Pb is a good mask in any oxygen-free halocarbon plasma. Tin is expected to be a good mask in fluorine and iodine plasmas.

TABLE 2

Boiling Points For Group IV Hydrides, Oxides, And Halides[e] in °C.

| Element | Hydride | Oxide | Fluoride | Chloride | Bromide | Iodide |
|---|---|---|---|---|---|---|
| C | −164 | −78.5[d] | −128 | 77 | 189 | 171[b] |
| Si | −112 | 2230 | −86 | 57 | 154 | 287 |

TABLE 2-continued

Boiling Points For Group IV
Hydrides, Oxides, And Halides[e] in °C.

| Element | Hydride | Oxide | Fluoride | Chloride | Bromide | Iodide |
|---|---|---|---|---|---|---|
| Ge | −88 | 1115 | −37[a] | 84 | 187 | 240[a,c] |
| Sn | −52 | 1850[d] | 750[d] | 114 | 202 | 717 |
| Pb | [b] | >890[b] | 1290[c] | 950[c] | 916[c] | 954 |

[a]Sublimes
[b]Decomposes
[c]Divalent halide
[d]Dioxide
[e]Data from CRC Handbook of Chemistry and Physics, R. C. Weart, Ed., The Chemical Rubber Company, Cleveland, 1969

Figure 8:
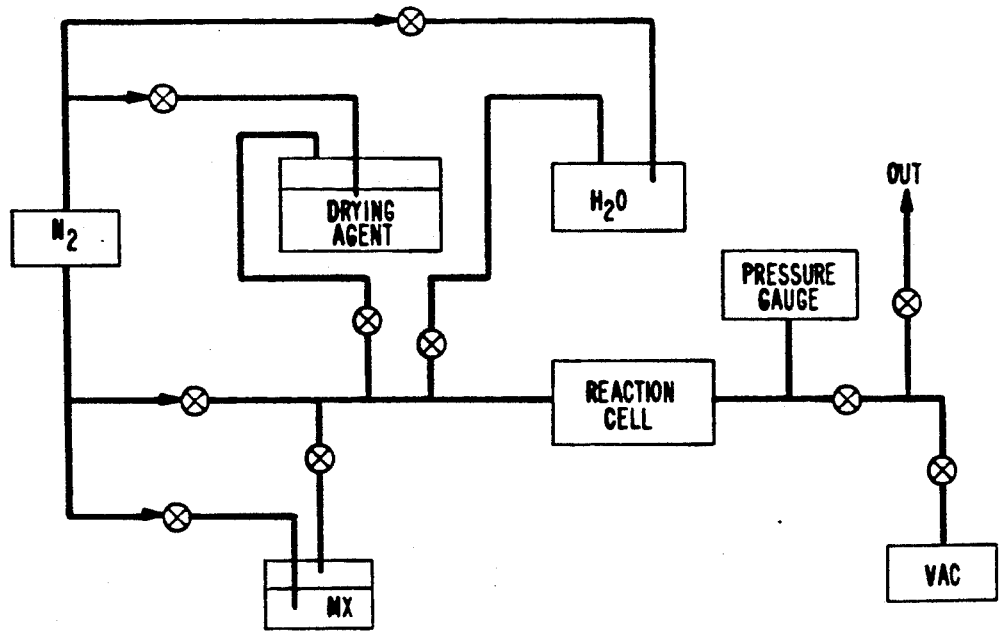
FIG. 8 shows a diagram of a system suitable for performing gas functionalization.
Figure 9:
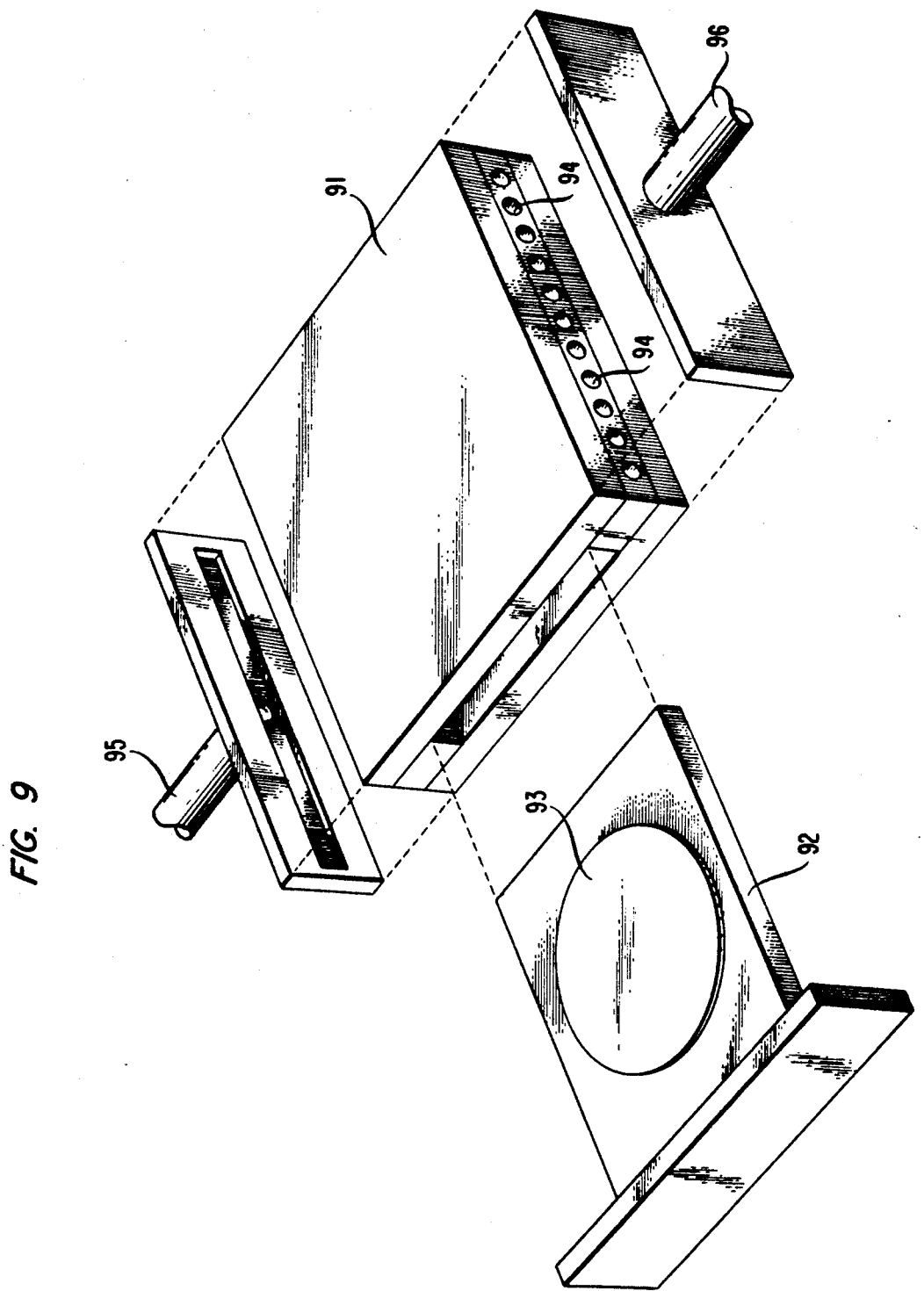
FIG. 9 shows a gas cell suitable for accomplishing gas functionalization.

The above technique is more fully illustrated in the Examples below, using the functionalization apparatus outlined in FIG. 8. Gas functionalization was conducted in a reaction cell; see FIG. 9. It comprises a stainless steel chamber 91 with a Teflon (trademark of E. I. Dupont) drawer 92 for insertion of a resist-coated wafer 93. Purging gases, carrier gases, and reactive inorganic-containing gases entered and exited the cell through a series of ports 94 on the sides of the reactor. The cell volume of 250 ml limited the equilibration time. Nevertheless, fast equilibration times, on the order of a few seconds, resulted.

The inorganic-containing gas (typically an inorganic halide) entered the reactor in a stream of dry carrier gas (either nitrogen or argon). A three-necked 250 ml flask was charged with approximately 50 ml of a suitable liquid inorganic halide such as $SnCl_4$, $SiCl_4$, or $Me_2SiCl_2$. The flask was equipped with a fritted gas inlet tube positioned below the surface of the inorganic halide. A second neck served as an exit to the reactor and was connected with a ¼ inch stainless steel glass-metal seal. Nitrogen bubbling through the inorganic halide entrained small amounts of inorganic halide. (In an alternate arrangement, a single necked flask connected directly to the gas cell was used.) Likewise, the system was connected to a reservoir containing drying agents such as hexamethyldisilazane or thionyl chloride. These drying agents removed trapped and residual surface water in the reactor by continuous reaction and purging. The gaseous products were removed by the carrier gas. Analogously, water (and other reagents) were introduced by the incorporation of a water entrainment system.

Typically, a resist-coated wafer was processed as follows: A portion of an irradiated wafer, or an entire 3 inch wafer, was placed in the reactor. The reactor typically was evacuated for 1 minute to a pressure of 0.1 Torr. After isolating the reactor from the vacuum pump, the inorganic halide reservoir was opened to the reactor through inlet 95. The $N_2$/MX mixture was allowed to pressurize the reactor to a pressure of 2-3 psi (2 seconds). The outlet 96 was then opened, and the $N_2$/MX mixture was allowed to pass over the surface of the wafer for 1-120 seconds. Then the carrier gas was turned off. The reactor was evacuated for 5 minutes to remove all traces of gaseous MX. The functionalized resist-coated wafer was then removed and subjected to oxygen reactive ion etching. Etching was done in a Cooke Vacuum Products Reactive Ion Etcher using oxygen as the sole etchant. The typical etching conditions were 20 W, 10-20 mTorr $O_2$, and an oxygen flow of 8-12 sccm.

EXAMPLE I

This Example illustrates the "negative tone" embodiment of FIG. 1. A silicon wafer was spin-coated with a solution of poly(2,3-dichloro-1-propyl acrylate), DCPA. The coated wafer was baked at 80 degrees C. for 0.5 hour. The resulting DCPA film thickness was 1 μm. The film was selectively irradiated with a scanning electron beam to a dose of 50 microcoulombs/$cm^2$ at 10 kV. The film was then placed in the above gas functionalization cell, GFC, which was heated to 90 degrees C. The cell was first flushed with dry nitrogen at 600 ml/minute for 5 minutes, and then with a 14.6 percent diborane ($B_2H_6$) in nitrogen mixture at 300 ml/minute for 5 minutes. The gas inlet and outlets were closed, and the DCPA film was allowed to sit in the $B_2H_6$/nitrogen mixture for 30 minutes. This functionalized the DCPA in irradiated regions with the $B_2H_6$. The cell was then flushed with dry nitrogen at 600 ml/minute for 5 minutes and the DCPA film removed from the cell. This last step accomplished selective desorption of the inorganic gas ($B_2H_6$) in regions of the DCPA not functionalized. (It also removed unreacted $B_2H_6$ in the irradiated regions.) The DCPA film was developed by reactive ion etching in an oxygen atmosphere. The electron beam irradiated regions of the DCPA film etched at a slower rate, due to boron incorporation in these areas, than the unirradiated film regions. The etching process was halted when the unirradiated film regions were completely etched. A 0.17 μm (negative) relief image remained in the irradiated film regions. The process resolved 0.5 μm features. A control DCPA film, for the purposes of comparison, was prepared and treated as the above film, with the exclusion of the $B_2H_6$/nitrogen treatment. Electron beam irradiation of a DCPA film to 50 microcoulombs/$cm^2$ resulted in a slight loss of film thickness in the irradiated film regions. Reactive ion etching in oxygen resulted in a 0.08 μm positive image for the control DCPA film. Therefore, the thickness difference between the $B_2H_6$-treated and control DCPA films after development was 0.25 μm.

EXAMPLE II

This Example illustrates the "positive tone" embodiment of FIG. 1. A silicon wafer was spin-coated with a solution of a copolymer of 2,2,2-trichloroethyl acrylate (TCEA) and allyl acrylate (AA). The copolymer composition was 87 percent TCEA and 13 percent AA. The film was baked, irradiated with an electron beam as in Example I, treated with $B_2H_6$ at 40 degrees C, and developed by reactive ion etching as in Example I. The irradiated regions etched at a greater rate than unirradiated film regions, resulting in a positive tone image of 0.18 μm. The process resolved 0.5 μm features. A control film, as in Example I, yielded a 0.07 μm positive image. Thus, the thickness difference between the $B_2H_6$-treated and control copolymer films after development was 0.11 μm.

EXAMPLE III

Figure 4:
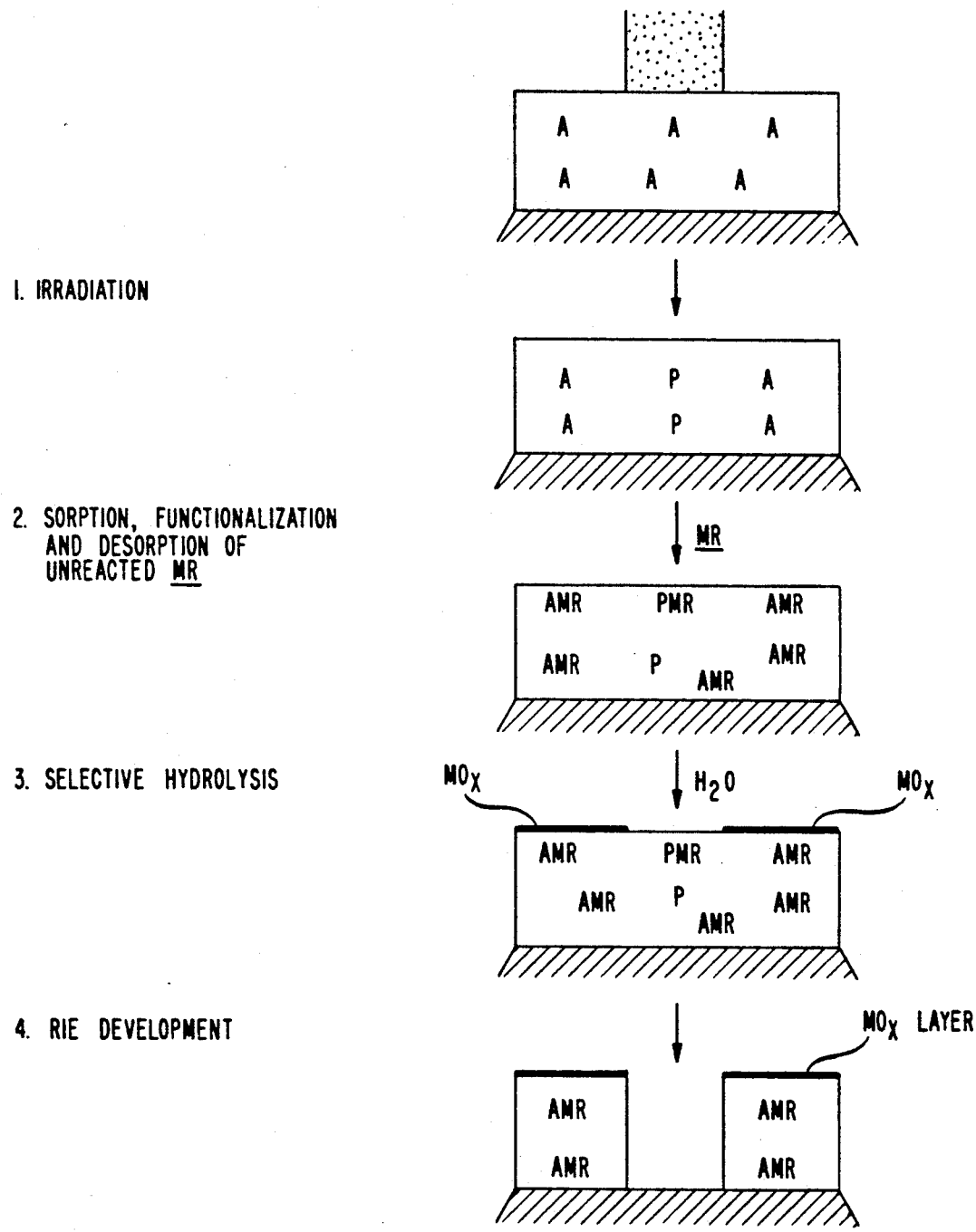
FIG. 4 shows functionalization with the aid of $H_2O$ as a reactant.

A silicon wafer was coated with Selectilux N-60 resist by spin-coating to give a 1 μm thick film. This resist comprises an azide as a sensitizer. The spun film was baked at 80 degrees C for 15 minutes in a forced air oven and irradiated for 16 seconds on a Cobilt Model CA2020H contact printer utilizing ultraviolet radiation having wavelengths predominately near 366 nanometers. The wafer was placed in a gas reaction cell which was evacuated for 2 minutes to a pressure of at least 0.1 Torr. Then silicon tetrachloride (SiCl$_4$), maintained at its saturated vapor pressure in a 1 liter ballast tank, was admitted to the reactor. After treatment for 7 seconds, the reactor was evacuated for 2–5 minutes to a pressure of at least 0.1 Torr, and the cell was filled to atmospheric pressure with dry inert gas (N$_2$ or Ar). The substrate was transferred to a reactive ion etching station and etched in O$_2$ as before for 6–7 minutes. This caused complete clearing of the irradiated regions and left 6,500–7,000 Angstroms of film in the unirradiated regions. The resolution achieved was 0.6 µm lines and 1.4 µm spaces equivalent to the actual measured dimensions of the nominal 1.0 µm lines and spaces on the chrome mask. This Example illustrates the "positive tone" embodiment of FIG. 4. An analysis of the functionalized resist prior to plasma development showed that a significant amount of inorganic species also reacted in the irradiated region. Thus, instead of merely producing group "P" in the irradiated region (see FIG. 1), inorganic-containing groups "PMR" subsisted there, along with groups "AMR" in the unirradiated region, as before. However, the groups "AMR" were found to form complexes with the azide sensitizer, and these complexes were readily hydrolyzed upon exposure to water vapor in the ambient after the gas cell treatment. A protective oxide thus is formed in the unirradiated regions. In contrast, in the irradiated regions, the azide sensitizer was substantially converted to an amine compound during the irradiation process, forming an amino-inorganic compound upon exposure to the inorganic gas. This amino-inorganic compound (PMR) was not as protective as the AMR compound, resulting in the positive tone image of FIG. 4. In other experiments substantially similar to this Example, SnCl$_4$ and (CH$_3$)$_2$SiCl$_2$ were successfully used instead of SiCl$_4$ as the inorganic gas. These experiments and subsequent analysis show the utility of forming complexes during the functionalization step. A "complex" is a recognized type of chemical bonding typically weaker than covalent bonding, wherein electrons are shared among the groups forming the complex; see *Organic Charge-Transfer Complexes*, at page 2, R. Foster, Academic Press, New York (1969).

Figure 5:
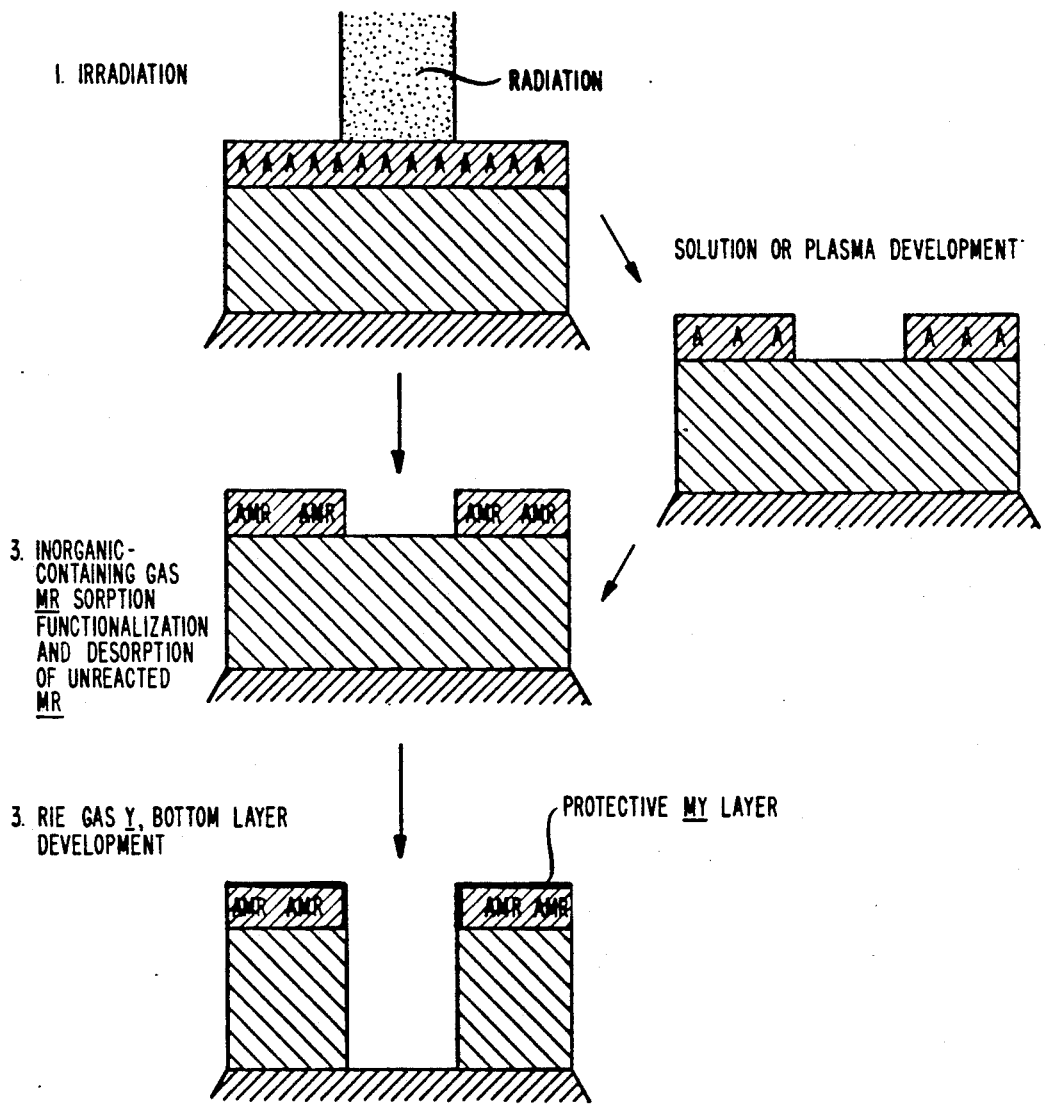
FIG. 5 shows a dual layer technique whereby an inorganic-containing gas MR is sorbed into unirradiated regions of the top layer to produce a positive tone image in the top and bottom layers upon reactive ion etching of the bottom layer.
Figure 6:
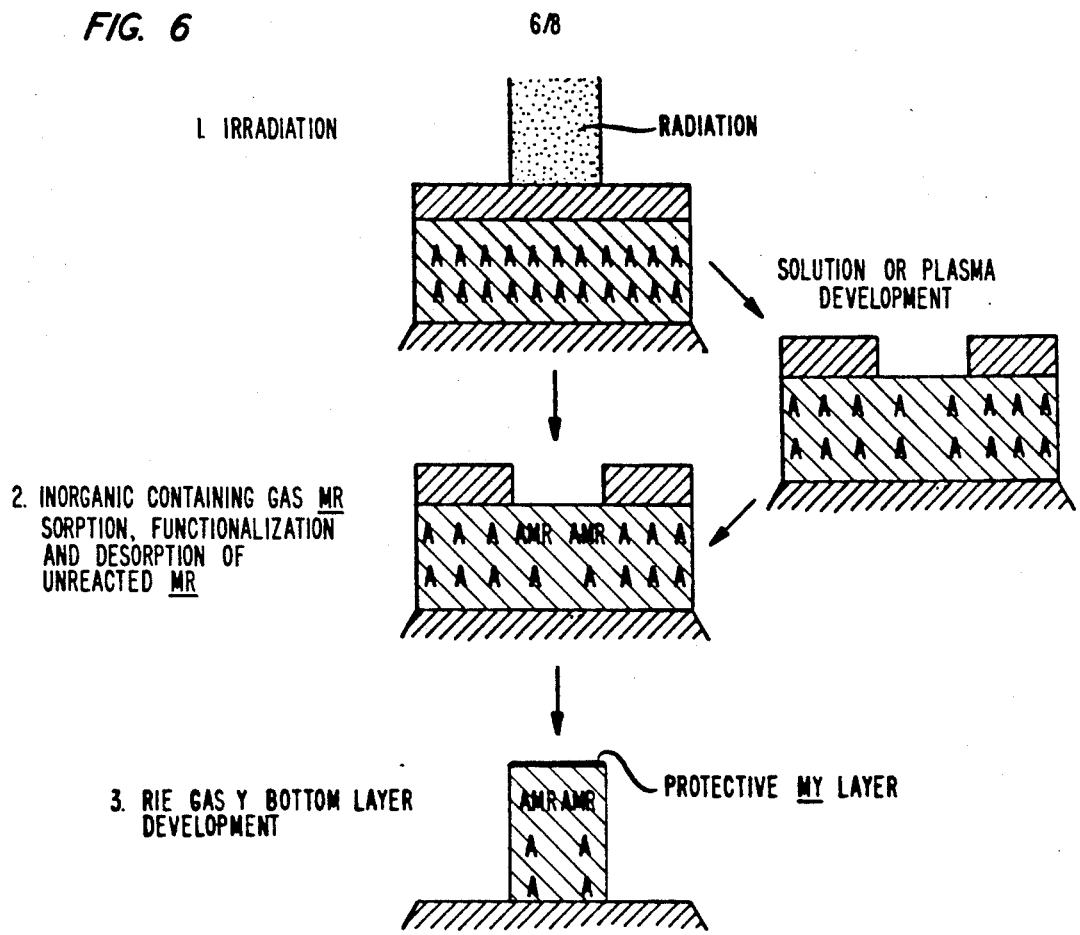
FIG. 6 shows a dual layer technique whereby an inorganic-containing gas is sorbed into the bottom layer to obtain a negative tone image in the bottom layer upon etching starting from a positive tone top layer.

While the foregoing has illustrated the use of actinic radiation to form the desired pattern, it is also possible to use the present technique to define an underlying layer in a multilevel resist. In one embodiment, referring to FIG. 5, actinic radiation and subsequent development produce a positive tone image in the top layer of a bilevel resist. Gaseous inorganic functionalization selectively produces a protective layer in the remaining (unirradiated) regions of the top layer, but not in the bottom layer. It is possible for this top level to be a conventional wet-developed or plasma-developed resist, with the gaseous functionalization occurring after conventional development. Alternately, the top level can also be developed by the present inventive technique. In either case, after the gaseous inorganic treatment, the top layer includes an inorganic coating that protects it upon exposure to a plasma that develops the underlying layer. If the plasma is produced by a reactive ion etching apparatus, or other apparatus that imparts a degree of anisotropy to the development, then a relatively straight-walled relief image can be produced in the underlying layer. In an alternate embodiment of the multilevel technique, referring to FIG. 6, the top layer is patterned by actinic radiation and developed so as to produce a positive tone image. Then, the selective functionalization produces a protective layer in the uncovered underlying regions. The protective layer, upon plasma etching, then produces a negative tone image, wherein both the top layer and the unfunctionalized (unprotected) regions of the bottom layer are removed.

Figure 7:
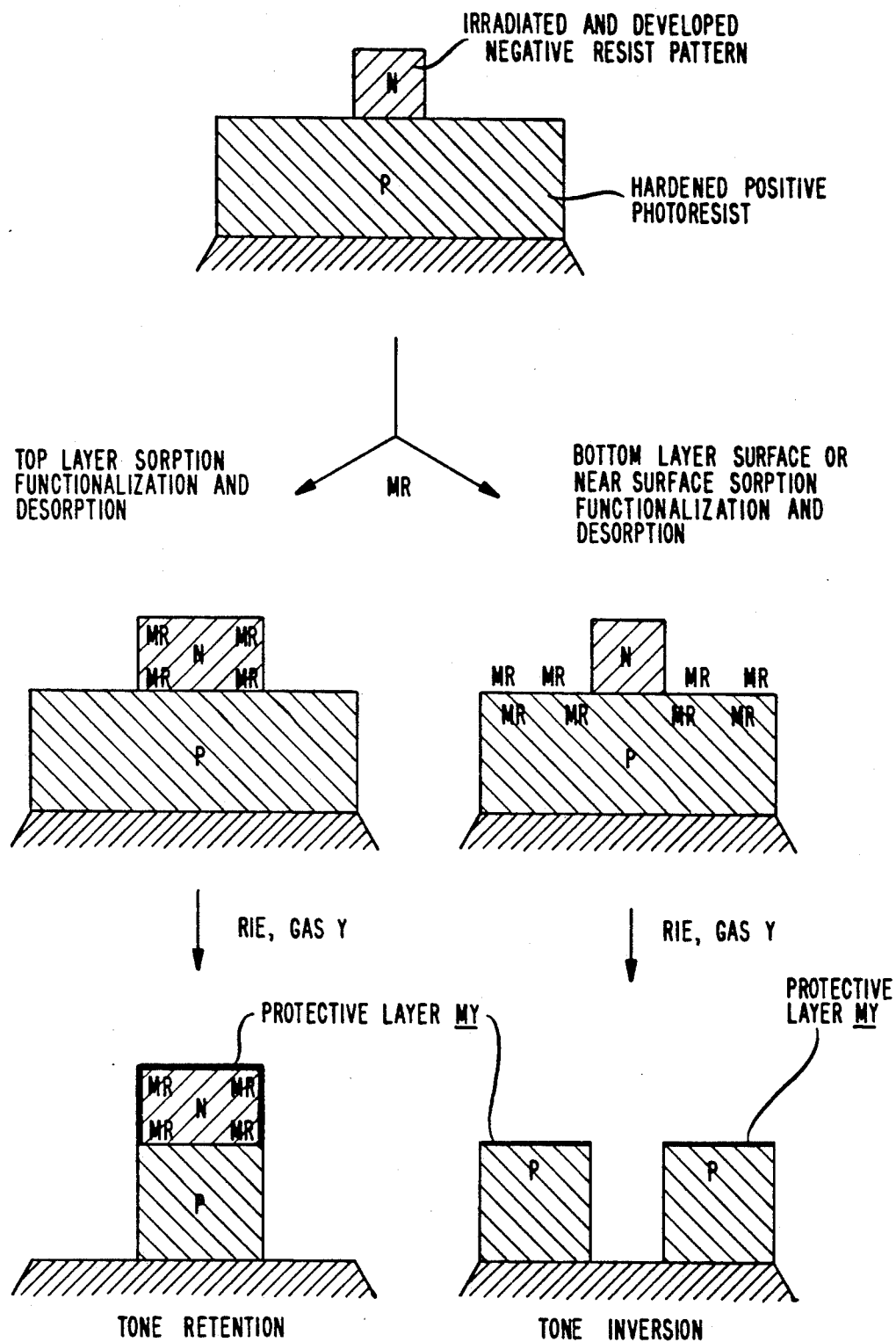
FIG. 7 shows a dual layer technique whereby a negative tone top layer is used to form either a negative or positive tone image in a bottom layer.

It also possible to practice the multilevel technique utilizing a negative tone image in the top layer. Referring to FIG. 7, the negative resist pattern can be exposed and developed by a conventional technique; for example, a wet-developed photoresist. The resist is then exposed to an inorganic gas that selectively sorbs either into the negative resist pattern or the underlying layer. In the former case, the inorganic species protects the negative resist region upon subsequent plasma etching to produce a negative tone pattern, as indicated in FIG. 7. In the alternate embodiment of FIG. 7, wherein the inorganic gas sorbs only into the near-surface regions of the underlying resist region, the irradiated portion is removed, leaving a positive tone image.

The multilevel resist techniques will be more fully illustrated by means of the following Examples.

EXAMPLE IV

This Example illustrates the "tone retention" dual-layer embodiment shown in FIG. 7. A silicon wafer was spin-coated with HPR-204 positive photoresist (Philip A. Hunt Chemical Company) to give a 1.0 µm thick resist layer. The coated substrate was baked for 2 hours at 200 degrees C to give a hard-baked organic resist layer that was insoluble in organic solvents. This was spin-coated with Selectilux N-60 negative photoresist (E. M. Industries) to give a 6,000 Angstrom layer after baking for 15 minutes at 80 degrees C. It was exposed to UV-visible light through a mask on a Cobilt contact printer for 2 seconds and was solution developed with N-60 developer to give 3,000 Angstrom thick negative resist patterns with 1.5 µm line and space resolution. It was treated for 1 minute with SiCl$_4$ vapor (300 mm pressure) in the above gas-phase reactor to selectively functionalize the topmost negative resist layer (as previously patterned). Then the areas not covered by negative resist were anisotropically etched for 7 minutes in a reactive ion etcher as above to remove >1.0 µm of the bottom hard-baked layer. No substantial loss of resist was observed in the remaining negative resist patterns. Resolution was 1.5 µm for lines and spaces and was limited by the resolution in the top resist layer. Negligible linewidth loss (<0.1 µm) was observed during the O$_2$ RIE transfer process.

EXAMPLE V

In a manner analogous to Example IV, Selectilux N-60 was used as both the top and bottom layers. Thus, a silicon wafer was spin-coated with Selectilux N-60 resist to give a 1.4 µm thick film. The coated substrate was hardened in a Ne plasma (100 W, 1.0 Torr) for 15 minutes. Then the substrate was spin-coated with Selectilux N-60 to give a 6,000 Angstrom thick film. After baking for 15 minutes at 80 degrees C., it was exposed for 4 seconds on a Cobilt contact printer as in Example IV. 3,500 Angstrom thick negative tone patterns were obtained upon development using N-60 developer to give 1.25–1.50 µm resolution for lines and spaces. The sample was treated with SiCl$_4$ and subjected to O$_2$ RIE as in Example IV to give 1.25–1.50 µm line and space resolution, complete clearing of uncovered regions, and negligible thickness and linewidth (<0.1 µm) loss when etched for 13 minutes, and when overetched for an additional 5 minutes.

EXAMPLE VI

In analogy to Example V, poly(glycidyl methacrylate-co-3-chlorostyrene) was spin-coated to a thickness of 1.2 μm on a silicon wafer and hardened in a Ne plasma. The use of a plasma for hardening is desirable to reduce gas sorption in the cleared portion of the underlying layer, which can lead to reduced resolution, and also to substantially eliminate intermixing between the top and bottom layers; see "Plasma Pretreatment to Improve Resist Properties by Reduction of Resist Flow During Postbake," J. M. Moran and G. N. Taylor, *Journal of Vacuum Science and Technology*, Vol. 19(4), pages 1127-1130 (1981). Then HPR-204 positive resist was spin-coated to a thickness of 8,000 Angstroms on the hardened N-60 layer. After baking for 15-20 minutes at 80 degrees C., it was exposed for 25 seconds (carriage setting 177, aperture 4) with UV-visible light on a Perkin-Elmer Model 500 1:1 projection printer. Positive tone patterns having 1.0 μm resolution were obtained upon development using LSI aqueous alkaline developer. The resolution was limited by pattern quality on the mask. The substrate was treated for 2 minutes with 10 mm $TiCl_4$ in the above gas-phase reactor to selectively deposit Ti compounds on the positive tone topmost patterned resist. $O_2$ RIE, as in Examples IV and V, for 15 minutes completely cleared the uncovered bottom resist layer. Negligible resist thickness and linewidth losses (<0.1 μm) were observed during the transfer process, although the sample was overetched for nearly 3 minutes. Final resolution was 1.0 μm lines and spaces equivalent to the mask patterns.

In this last Example, it was found upon analysis that protective oxytitanium compounds were formed at least in part prior to the oxygen plasma treatment. We conclude that this is due in part to reaction with water vapor ($H_2O$) in the ambient above the resist after its removal from the functionalization cell, and in part due to reaction of $TiCl_4$ with $H_2O$ selectively sorbed in the positive resist layer. It thus is apparent that while the development plasma can assist in the protective layer formation, it need not do so in some cases. It is also possible that water vapor forms a lower valent oxide in some cases, with the plasma converting it to a higher valent oxide during development. It appears that the ambient environment in most semiconductor clean rooms, at about 30 to 40 percent relative humidity, is typically suitable for the hydrolyzing function. It is also possible to control the amount of water on the surface of the organic layer by exposure to a gas that reacts with water to produce gaseous products. For example, exposing the surface of cross-linked polystyrene to carbonyl fluoride has been found to reduce the amount of water on the surface.

The foregoing has shown the use of an inorganic compound to protect portions of the organic layer in which it is formed. However, we estimate that an inorganic compound formed from a sorbed gas can also be used to protect the organic layer during plasma etching of an underlying inorganic layer. For example, etching of aluminum or a silicide is typically accomplished using a plasma atmosphere comprising a halocarbon, and sometimes also oxygen. Such plasmas can attack the overlying resist, leading to loss of linewidth dimensions. Improved protection of the resist can be obtained by the use of an inorganic compound formed in the resist according to the present inventive technique. The resist can be an otherwise conventional resist developed by solution or plasma development, followed by the inorganic gas treatment. Alternately, the resist can be developed according to the present technique. In that case, a first plasma can be used to develop the resist, and a second plasma used to etch the underlying inorganic layer. It is also possible that a single plasma type can be used for both purposes.

As noted above, the present technique can be used for making a wide variety of articles, including solid-state devices. As used herein, the term "device precursor" includes a semiconductor or insulator substrate, a magnetic substrate, an optical waveguide substrate, and a lithographic shadow mask substrate. It also includes a substrate having previously formed features, structures, or devices thereon. A wide variety of other metallic species can be used in the sorbed gas, as noted above.

What is claimed is:

1. A method of making an article, including at least one pattern delineation step
   characterized by steps comprising:
   providing a device precursor that includes at least one organic layer;
   sorbing a gas containing an inorganic species into said layer;
   selectively forming a protective compound comprising said inorganic species in at least one portion of said layer; and
   removing by exposure to a plasma at least one other portion of said device precursor that is not protected by said protective compound, wherein said selectively forming a protective compound in said layer is accomplished in part by selectively irradiating said layer with ultraviolet radiation.

2. A method of making an article including at least one pattern delineation step,
   characterized by steps comprising:
   providing a device precursor that includes at least one organic layer;
   selectively irradiating said layer with actinic radiation;
   thereafter sorbing a gas containing an inorganic species into said layer, whereby the sorbed gas functionalizes in the irradiated portions of said layer;
   substantially removing the unfunctionalized gas from said layer;
   forming a protective compound comprising said inorganic species in the irradiated portions of said layer;
   and removing by exposure to a plasma portions of said layer that are not protected by said protective compound, whereby a negative-tone image is obtained.

3. The method of claim 2 wherein said protective compound is formed at least in part by said exposure to a plasma, whereby said protective compound comprises at least one element derived from said plasma.

4. The method of claim 3 wherein said plasma comprises oxygen, wherein an oxide of said inorganic species is formed as said protective compound.

5. The method of claim 2 wherein said organic layer is an overlying layer in a multilevel resist.

6. The method of claim 2 wherein said inorganic species is selected from the group consisting of silicon, germanium, tin, lead, titanium, and boron.

7. The method of claim of claim 2 wherein said inorganic species is silicon.

8. The method of claim 2 wherein said inorganic species is a true metal.

9. The method of claim 2 wherein said gas is substantially sorbed only in a surface or near-surface region of said organic layer.

10. The method of claim 2 wherein said gas is substantially sorbed through the full thickness of said organic layer.

11. The method of claim 2 wherein said gas is an inorganic halide.

12. The method of claim 2 wherein said actinic radiation is ultraviolet radiation.

13. A method of making an article including at least one pattern delineation step,
characterized by steps comprising:
providing a device precursor that includes at least one organic layer;
selectively irradiating said layer with actinic radiation;
thereafter sorbing a gas containing an inorganic species into said layer, whereby the sorbed gas functionalizes in the unirradiated portions of said layer;
substantially removing the unfunctionalized gas from said layer;
forming a protective compound comprising said inorganic species in the unirradiated portions of said layer;
and removing by exposure to a plasma portions of said layer that are not protected by said protective compound, whereby a positive-tone image is obtained.

14. The method of claim 13 wherein said protective compound is formed at least in part by said exposure to a plasma, whereby said protective compound comprises at least one element derived from said plasma.

15. The method of claim 14 wherein said plasma comprises oxygen, wherein an oxide of said inorganic species is formed as said protective compound.

16. The method of claim 13 wherein said organic layer is an overlying layer in a multilevel resist.

17. The method of claim 13 wherein said inorganic species is selected from the group consisting of silicon, germanium, tin, lead, titanium, and boron.

18. The method of claim of claim 13 wherein said inorganic species is silicon.

19. The method of claim 13 wherein said inorganic species is a true metal.

20. The method of claim 13 wherein said gas is substantially sorbed only in a surface or near-surface region of said organic layer.

21. The method of claim 13 wherein said gas is substantially sorbed through the full thickness of said organic layer.

22. The method of claim 13 wherein said gas is an inorganic halide.

23. The method of claim 13 wherein said actinic radiation is ultraviolet radiation.

24. The method of claim 13 wherein said organic layer comprises a group that functionalizes with said inorganic species to form a complex that is thereafter hydrolized, thereby at least partially forming said protective compound.

25. The method of claim 24 wherein said group is an azide.

26. The method of claim 24 further comprising the step of exposing said organic layer to a gas that reacts with water to produce gaseous products, thereby controlling the amount of water on a surface of said organic layer.

27. A method of making an article including at least one pattern delineation step,
characterized by steps comprising:
providing a device precursor that includes at least one organic layer;
sorbing a gas containing an inorganic species into said layer;
thereafter selectively irradiating said layer with actinic radiation to remove the inorganic species from the irradiated portions of said layer;
forming a protective compound comprising said inorganic species in the unirradiated portions of said layer;
and removing by exposure to a plasma portions of said layer that are not protected by said protective compound, whereby a positive-tone image is obtained.

28. The method of claim 27 wherein said protective compound is formed at least in part by said exposure to a plasma, whereby said protective compound comprises at least one element derived from said plasma.

29. The method of claim 28 wherein said plasma comprises oxygen, wherein an oxide of said inorganic species is formed as said protective compound.

30. The method of claim 27 wherein said organic layer is an overlying layer in a multilevel resist.

31. The method of claim 27 wherein said inorganic species is selected from the group consisting of silicon, germanium, tin, lead, titanium, and boron.

32. The method of claim of claim 27 wherein said inorganic species is silicon.

33. The method of claim 27 wherein said inorganic species is a true metal.

34. The method of claim 27 wherein said gas is substantially sorbed only in a surface or near-surface region of said organic layer.

35. The method of claim 27 wherein said gas is substantially sorbed through the full thickness of said organic layer.

36. The method of claim 27 wherein said organic layer comprises a group that functionalizes with said inorganic species to form a complex that is thereafter hydrolized, thereby at least partially forming said protective compound.

37. The method of claim 36 wherein said group is an azide.

38. The method of claim 27 wherein said gas is an inorganic halide

39. The method of claim 27 further comprising the step of exposing said organic layer to a gas that reacts with water to produce gaseous products, thereby controlling the amount of water on a surface of said organic layer.

40. The method of claim 27 wherein said actinic radiation is ultraviolet radiation.

41. A method of making an article including at least one pattern delineation step,
characterized by steps comprising:
providing a device precursor that includes a resist layer overlying an underlying layer;
forming a lithographic pattern in said resist layer, whereby portions of said underlying layer are selectively uncovered;
sorbing a gas containing an inorganic species into the patterned resist layer;

forming a protective compound comprising said inorganic species in the patterned resist layer;

and removing by exposure to a plasma portions of said underlying layer that are not protected by said protective compound in said patterned resist layer.

42. The method of claim 41 wherein said protective compound is formed at least in part by said exposure to a plasma, whereby said protective compound comprises at least one element derived from said plasma.

43. The method of claim 42 wherein said plasma comprises oxygen, wherein an oxide of said inorganic species is formed as said protective compound.

44. The method of claim 41 wherein said inorganic species is selected from the group consisting of silicon, germanium, tin, lead, titanium, and boron.

45. The method of claim of claim 41 wherein said inorganic species is silicon.

46. The method of claim 41 wherein said inorganic species is a true metal.

47. The method of claim 41 wherein said gas is substantially sorbed only in a surface or near-surface region of said resist layer.

48. The method of claim 41 wherein said gas is substantially sorbed through the full thickness of said resist layer.

49. The method of claim 41 wherein said underlying layer is an organic layer.

50. The method of claim 41 wherein said underlying layer is an inorganic layer.

51. A method of making an article including at least one pattern delineation step Characterized by steps comprising:

providing a device precursor that includes at least one organic layer;

sorbing a gas containing an inorganic species into said layer;

selectively forming a protective compound comprising said inorganic species in at least one portion of said layer; and removing by exposure to a plasma at least one other portion of said device precursor that is not protected by said protective compound, wherein said organic layer comprises a group that reacts with said inorganic species to form a complex that is thereafter hydrolyzed, thereby at least partially forming said protective compound.

52. The method of claim 51 wherein said group is an azide

53. A method of making an article including at least one pattern delineation step characterized by steps comprising:

providing a device precursor that includes at least one organic layer;

sorbing a gas containing an inorganic species into said layer;

selectively forming a protective compound comprising said inorganic species in at least one portion of said layer; and removing by exposure to a plasma at least one other portion of said device precursor that is not protected by said protective compound;

and further comprising the step of exposing said organic layer to a gas that reacts with water to produce gaseous products, thereby controlling the amount of water on a surface of said organic layer.

* * * * *